United States Patent [19]

Uthe et al.

[11] Patent Number: 4,815,001

[45] Date of Patent: Mar. 21, 1989

[54] ULTRASONIC WIRE BONDING QUALITY MONITOR AND METHOD

[75] Inventors: P. Michael Uthe, Redwood City, Calif.; Paul S. Bamburak, Trenton, N.J.

[73] Assignee: Crestek, Inc., Belmont, Calif.

[21] Appl. No.: 868,612

[22] Filed: May 30, 1986

[51] Int. Cl.$^4$ .................... G06F 15/46; B23K 20/10
[52] U.S. Cl. .................... 364/477; 228/103; 364/552
[58] Field of Search .................... 364/552, 477, 506; 228/1.1, 9, 102, 103, 110

[56] References Cited

U.S. PATENT DOCUMENTS

| | | | |
|---|---|---|---|
| 3,302,277 | 2/1967 | Pruden et al. | 29/407 |
| 3,573,781 | 4/1971 | Shoh | 228/1.1 |
| 3,636,456 | 1/1972 | Wright | 328/32 |
| 3,693,158 | 9/1972 | Uthe | 340/172 R |
| 3,734,382 | 5/1973 | Spanjer | 228/1 |
| 3,763,545 | 10/1973 | Spanjer | 29/470.1 |
| 3,784,079 | 1/1974 | Spanjer | 228/1 |
| 3,827,619 | 8/1974 | Cusick et al. | 228/1 |
| 3,852,999 | 12/1974 | Wright | 73/67.1 |
| 3,890,831 | 6/1975 | Cusick et al. | 73/88 B |
| 4,040,885 | 8/1977 | Hight et al. | 156/378 |
| 4,047,657 | 9/1977 | Mims | 228/1.1 |
| 4,215,583 | 8/1980 | Botsco et al. | 73/582 |
| 4,341,574 | 7/1982 | Landes | 156/64 |
| 4,389,601 | 6/1983 | Sullivan | 318/118 |
| 4,437,604 | 3/1984 | Razon et al. | 228/179 |
| 4,438,880 | 3/1984 | Smith et al. | 228/1 A |
| 4,466,565 | 8/1984 | Miyazima | 228/1 B |
| 4,599,899 | 7/1986 | Jero et al. | 228/103 |
| 4,606,490 | 8/1986 | Chan et al. | 228/103 |
| 4,631,685 | 12/1986 | Peter | 364/477 |

FOREIGN PATENT DOCUMENTS 0880677 11/1981 U.S.S.R. .................... 228/1.1

Primary Examiner—Parshotam S. Lall
Assistant Examiner—S. A. Melnick
Attorney, Agent, or Firm—Limbach, Limbach & Sutton

[57] ABSTRACT

A bond quality monitor and method for monitoring and analyzing the relative quality of bonding operations performed by ultrasonic bonding machines is disclosed. The bond quality monitor (40) includes an analog bond monitoring circuit (42) and a digital microcomputer (44). The bond monitoring circuit, which is placed in series between an ultrasonic signal generator (26) and its corresponding ultrasonic transducer (18), monitors the transducer power signal generated by the ultrasonic signal generator and performs a series of analog computations based on the logarithm of the impedance of the transducer in order to create a measure of bond quality. The microcomputer controls the operation of the bond monitoring circuit and performs comparisons to determine bond quality relative to previously monitored good quality bonds.

29 Claims, 9 Drawing Sheets

BOND MONITORING CIRCUITRY

ULTRASONIC WIRE BONDING QUALITY MONITOR AND METHOD

BACKGROUND OF THE INVENTION

1. Field of the Invention

The invention relates generally to the field of ultrasonic metal welding, which includes ultrasonic wire bonding, and relates more particularly to an apparatus and method for monitoring and analyzing the quality of the ultrasonic wire bonding process.

2. Description of the Relevant Art

Ultrasonic wire bonding is used extensively throughout the semiconductor industry to form electrical interconnections to integrated and hybrid circuits. In the process of ultrasonic wire bonding, a metallurgical bond is formed through the proper transmittal of ultrasonic vibrations to the bond interface between a wire and a bonding pad. In general, the bonding process involves the following steps: (1) a wire is placed in contact with a bonding pad, and a tool is placed on top of the wire; (2) the tool applies pressure against the wire, forcing the wire against the bonding pad; (3) an ultrasonic transducer is energized by a high frequency power signal to apply an ultrasonic vibration to the tool, which causes the tool to oscillate in the plane of the bonding pad; (4) the friction between the wire and the bonding pad is overcome, and the wire scrubs against the surface of the bonding pad, causing localized softening and plastic flow of the wire and/or bonding pad; (5) after several milliseconds of scrubbing, the transducer is deenergized, which stops the motion of the tool and wire and allows a weld to form between the wire and the bonding pad; and (6) the tool is lifted away from the now bonded wire. Key parameters for the ultrasonic bonding process include the frequency, duration, and amplitude of the ultrasonic vibrations, the pressure exerted by the tool, and the friction between the wire and the bonding pad, which is influenced by the materials of the wire and bonding pad, by their state of cleanliness, and by the ambient environmental conditions. The precise shape and surface finish of the bonding tool also plays a major role.

Certain factors may cause the bond to be defective. A bond may not form properly if, for example, the bonding pad or the wire is not clean. If the transducer is energized for too long a time, the bond may not form properly due to overheating of the materials or fracturing of the substrate. If the wire feed mechanism is faulty, or if the tool fails to contact the bonding pad, no bond will be formed.

Even if good bonds are produced at the beginning of a production run, there is no guarantee that good bonds will continue to be produced throughout the run. Tool wear, material build-up on the tool, tool replacement, variations in ambient temperature and humidity, and variations in the wire and bonding pad materials are factors that may contribute to poor bonding even though good bonds were produced initially. As a result of the foregoing, proper quality control procedures dictate that the quality of the bonding operations be constantly monitored. Continual quality monitoring is especially important in the case of automatic bonders, where numerous bonds are made in rapid succession, because the failure to detect faulty bonds may ruin a large number of circuit devices.

Prior ultrasonic bond quality monitors have utilized a variety of techniques in their attempts to reliably monitor the quality of the ultrasonic bonding operation. One such prior art apparatus, disclosed in U.S. Pat. No. 3,302,277 issued on Feb. 7, 1967 to Pruden, et al., measures bond quality by monitoring the voltage drop of a transistor contained on the substrate to which the wire is to be bonded. A bond quality monitor that measures bond quality by monitoring the amplitudes of the transverse and tangential motions of the bonding tool is disclosed in U.S. Pat. No. 3,890,831 issued on June 24, 1975 to Cusick, et al. Another bond quality monitor, disclosed in U.S. Pat. No. 4,040,885 issued on Aug. 9, 1977 to Hight, et al., measures bond quality by detecting the amplitude of the bonding tool during the bonding operation and comparing it to the amplitude of the bonding tool under no-load conditions. Certain bond quality monitors base their technique on the measurement of the electrical impedance of the ultrasonic transducer, including the apparatus disclosed in U.S. Pat. No. 4,341,574 issued on July 27, 1982 to Landes. The Landes apparatus determines when to de-activate the ultrasonic transducer at the conclusion of the bonding operation by detecting the zero-crossing of the second derivative of the impedance. Also, U.S. Pat. Nos. 3,636,456 issued on Jan. 18, 1972 and 3,852,999 issued on Dec. 10, 1974 to Wright, and 3,693,158 issued on Sept. 19, 1972 to Uthe, all of which are assigned to the assignee of the present invention, all disclose bond quality monitors that monitor the impedance of the ultrasonic transducer.

Prior art bond quality monitors, such as those disclosed in the above listed references, fail to reliably monitor the quality of bonding operations in the real-world environment of the production floor. These bond quality monitors attempt to create an absolute measurement of bond quality, which is an approach that is doomed to failure due to unavoidable variations in process parameters and environmental conditions.

SUMMARY OF THE INVENTION

In accordance with the illustrated preferred embodiment, the present invention provides an apparatus and method for in situ monitoring and real-time analyzing the quality of bonding operations performed by ultrasonic wire bonding machines. The apparatus of the present invention monitors the transducer power signal that excites an ultrasonic transducer to perform a bonding operation. The apparatus includes: sensing circuitry for measuring the current and voltage of the transducer power signal during a bonding operation, signal processing circuitry for combining and filtering the measured current and voltage of the transducer power signal to generate a synthesized signal that is substantially constant over a portion of the bonding operation when producing good quality bonds, and integration circuitry for integrating the synthesized signal over that portion of the bonding operation to compute a bond value indicative of the quality of that particular bond. The method of the present invention includes the steps of: sensing the current and voltage of the transducer power signal, combining the measured current and volt of the transducer power signal to generate a synthesized signal that is substantially constant over a portion of the bonding operation when producing good quality bonds, and integrating the synthesized signal over that portion of the bonding operation to compute a bond value indicative of the quality of that particular bond. The quality of each bonding operation is determined by a comparison of the computed bond value to prior bond values recorded during the formation of known good bonds, where any relatively large deviation from the average of the prior bond values would signify a bonding operation of suspect quality. The apparatus and method of the present invention, thus, determine the relative quality of a bonding operation in comparison to prior bonding operations.

In the preferred embodiment of the apparatus of the present invention, an analog bond monitoring circuit monitors the transducer power signal and computes the bond values, while a digital microcomputer controls the operation of the bond monitoring circuit and performs the comparisons between the measured and prior bond values.

The bond monitoring circuit, which is placed in series between the ultrasonic signal generator and the ultrasonic transducer, monitors the transducer power signal generated by the ultrasonic signal generator and performs a series of analog computations on the transducer power signal to create a measure of bond quality, referred to herein as a "bond value." The computations occur within a time window that begins after the bonding operation has begun and ends prior to the completion of the bonding operation, during which time the transducer is continuously oscillating. First, the logarithm of the dynamic impedance of the transducer is formulated by dividing the voltage of the transducer power signal by its current utilizing a logarithmic difference amplifier. Next, a value equal to the quiescent or steady state impedance of the transducer is subtracted from the logarithm of the dynamic impedance, and the result is filtered. The filter stage has been constructed so that, when a good bond is performed, the output of the filter stage is a substantially constant signal throughout the time window. The output of the filter stage is integrated over the interval of the time window, and the integral value is converted into a digital value by an analog to digital converter. The output value of the converter is the bond value for that particular bonding operation.

In a stable environment, such as that found in a laboratory, the bond value alone would be sufficient to reliably indicate bond quality. Under stable operating conditions, the bond value of a bad weld is measurably different from that of a good weld. In a manufacturing environment, however, conditions such as ambient temperature, humidity, wire composition, and others will change the precise shape and magnitude of the impedance function for a good bond, and will, thus, change the bond value of a good bond. Since an absolute measure of bond quality is impractical, the bond quality monitor of the present invention utilizes a measure of relative bond quality, rather than absolute bond quality.

The digital microcomputer of the present invention accommodates gradual changes in the processing environment by utilizing a statistical technique to determine relative bond quality. First, the bond quality monitor is calibrated by creating several consecutive good bonds, and storing the measured bond values in a data base. These bond values are average to compute a bond value reference against which subsequent measured bond values are compared.

Once calibrated, the bond quality monitor can be used to monitor the consistency and relative quality of subsequent bonding operations. The microcomputer takes the bond value generated by the bond monitoring circuit during the formation of a subsequent bond, and compares that value to the bond value reference. A quality factor is computed that is proportional to the difference between the measured bond value and bond value reference. The quality factor is an estimate of the quality of the just completed bond relative to the prior good bonds. The quality factor equals zero if the measured bond value equals the bond value reference. If the measured quality factor is less than a predefined limit, then the just completed bond is deemed to be a good bond. When a good bond is performed, its bond value replaces the oldest bond value in the calibration memory and a new average is computed to update the bond value reference. Because the memory retains only a certain number of the most recent good bond values, gradual changes in the processing parameters are accommodated by corresponding gradual changes in the bond value reference. If the measured quality factor is greater than the predefined limit, then the just completed bond is deemed to be a bad bond. In this case, the bond quality monitor signals the operator that a bad bond has been made and, optionally, closes a relay to shut down the operation of the ultrasonic wire bonding machine.

The bond quality monitoring apparatus and method of the present invention reliably detects poor bonds, while having a low false detection rate. The bond quality monitor of the present invention is adaptable to many types of bonding environments and readily accommodates variations in the process parameters and environmental conditions.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter. For example, the term ultrasonic bonding as used herein includes a wide range of ultrasonic metal welding processes such as thermosonic bonding, tape bonding, ribbon bonding, and beam lead bonding, all of which utilize ultrasonic vibrations to create a bond or weld. For this reason, resort to the claims is necessary in order to determine such inventive subject matter.

DETAILED DESCRIPTION OF THE PREFERRED EMBODIMENT

FIGS. 1 through 9 of the drawings depict the preferred embodiment of the present invention for purposes of illustration and disclosure. One skilled in the art will readily recognize from the following discussion that alternative embodiments of the structures and methods illustrated herein may be employed without departing from the principles of the invention described herein.

Figure 1:
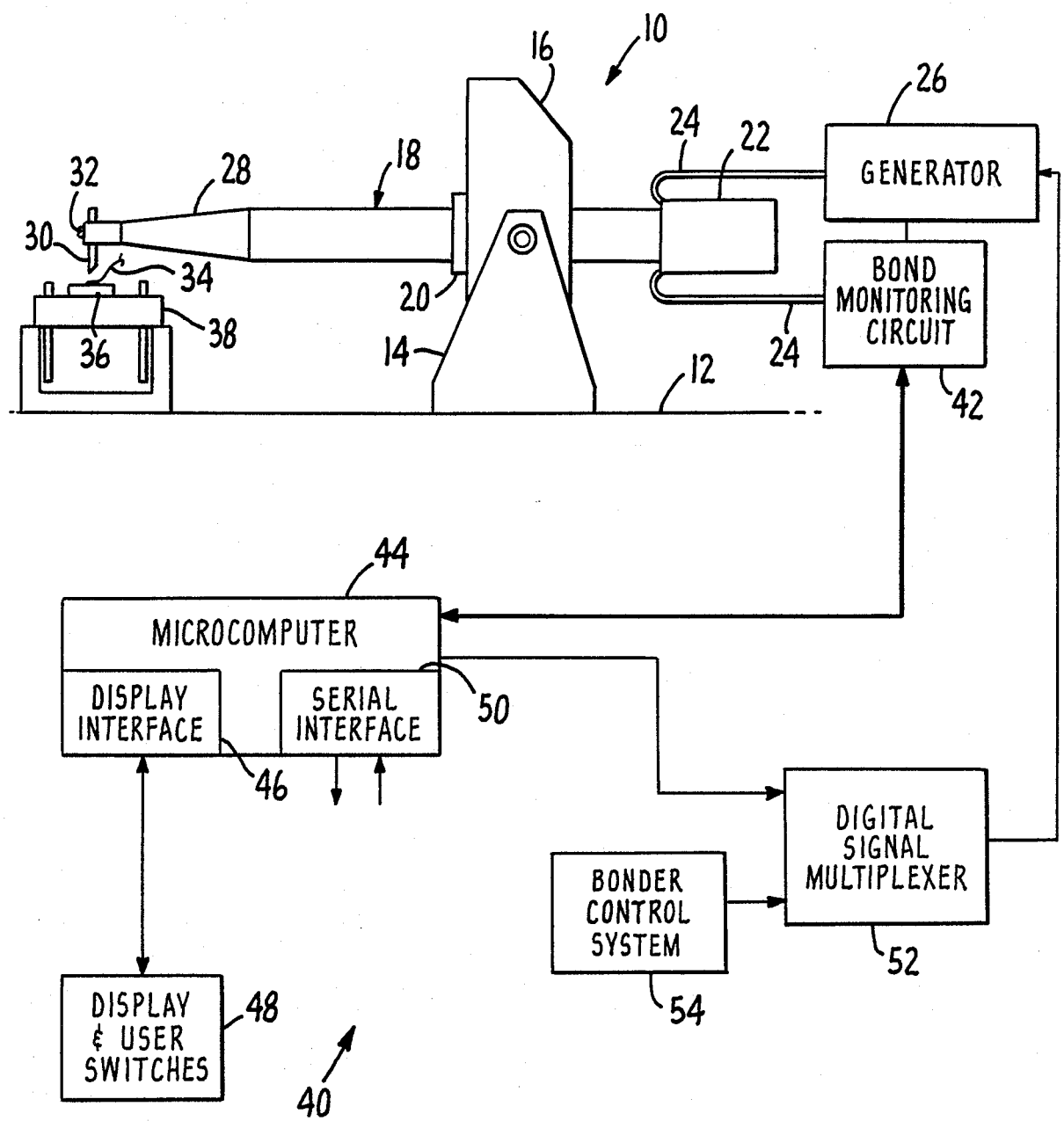
FIG. 1 is a schematic side view of an ultrasonic wire bonding machine and a block diagram of a bond quality monitor according to the present invention.

The preferred embodiments of the present invention comprise an apparatus and a method for monitoring and analyzing the quality of the bonding operations performed by an ultrasonic wire bonding machine. FIG. 1 is only a schematic view of the bonding machine and does not show the complex transducer supporting structures and mechanisms employed in actual bonding machines. As shown in FIG. 1, an ultrasonic wire bonding machine 10 includes a base or support frame 12 upon which is located a mounting yoke 14 that is pivotally connected to a hollow cylindrical clamping member 16 within which an ultrasonic transducer 18 is held by way of a collar 20. The transducer 18 is any one of a variety of structures for converting electrical energy into high frequency motion. The transducer 18 includes in or on its body an active element 22 which is typically either ferroelectric or ferromagnetic. High frequency electrical energy in the form of a transducer power signal having a frequency in the range of forty to one hundred KHz and supplied to the active element 22 via leads 24 from a generator 26 results in longitudinal vibration of the transducer body. The shape, size, and composition of the transducer 18 determine the mechanical resonant frequency thereof, and a generator capable of delivering a frequency equal to the resonant mechanical frequency is employed to drive the transducer.

The vibrational motion of the transducer 18 is concentrated at one end via an acoustical horn 28, which is typically constructed in common with the body of the transducer, and which is provided at its free end with an element for coupling the vibrational motion to the work pieces to be bonded. The element for coupling the vibrational motion of the transducer 18 to the work pieces includes a wedge or capillary tool 30 supported in a transverse bore through the tip of the horn 28 and held in place by a set screw 32.

The vibrational motion of the transducer 18 is directed in a plane parallel to the surface of the elements to be joined, which are a wire 34 and a bonding pad 36, such as contained on an integrated circuit chip. The chip is supported beneath the tool 30 by an clamp 38.

The wire 34 is bonded to the bonding pad 36 by first applying a downward force through the tool 30 to bring the wire and the bonding pad into contact, and then activating the vibrational motion of the transducer 18. The motion of the tool 30 causes the wire 34 to scrub against the surface of the bonding pad 36, which frictionally heats the wire and pad. Once the vibration motion of the transducer 18 is stopped, a weld forms between the wire and bonding pad.

The bond quality monitor 40 of the present invention preferably includes an analog bond monitoring circuit 42 and a digital microcomputer 44. The bond monitoring circuit 42 is coupled in series between the generator 26 and the active element 22 of the transducer 18, and computes a measure of the quality of the bonding operation, referred to herein as a "bond value", by monitoring the current and voltage of the transducer power signal. The microcomputer 44 is coupled to the bond monitoring circuit 42 for controlling some of the operations of the bond monitoring circuit and for computing a measure of relative bond quality, referred to herein as a "quality index." Included within the microcomputer 44 is a display interface 46 that enables the bond quality monitor 40 to communicate to an operator through a visual display and user switches 48. The display provides means for the bond quality monitor 40 to inform the operator of the status of the monitoring process, while the user switches provide means for the operator to control the operation of the bond quality monitor. A serial interface 50 may also be included in the microcomputer 44 for connecting the bond quality monitor 40 to a terminal, computer network, or other auxiliary input/output device. The microcomputer 44 is coupled to the generator 26 through a digital signal multiplexer 52, which permits either the bond quality monitor or a conventional bonder control system 54 to control the operation of the generator.

Figure 2:
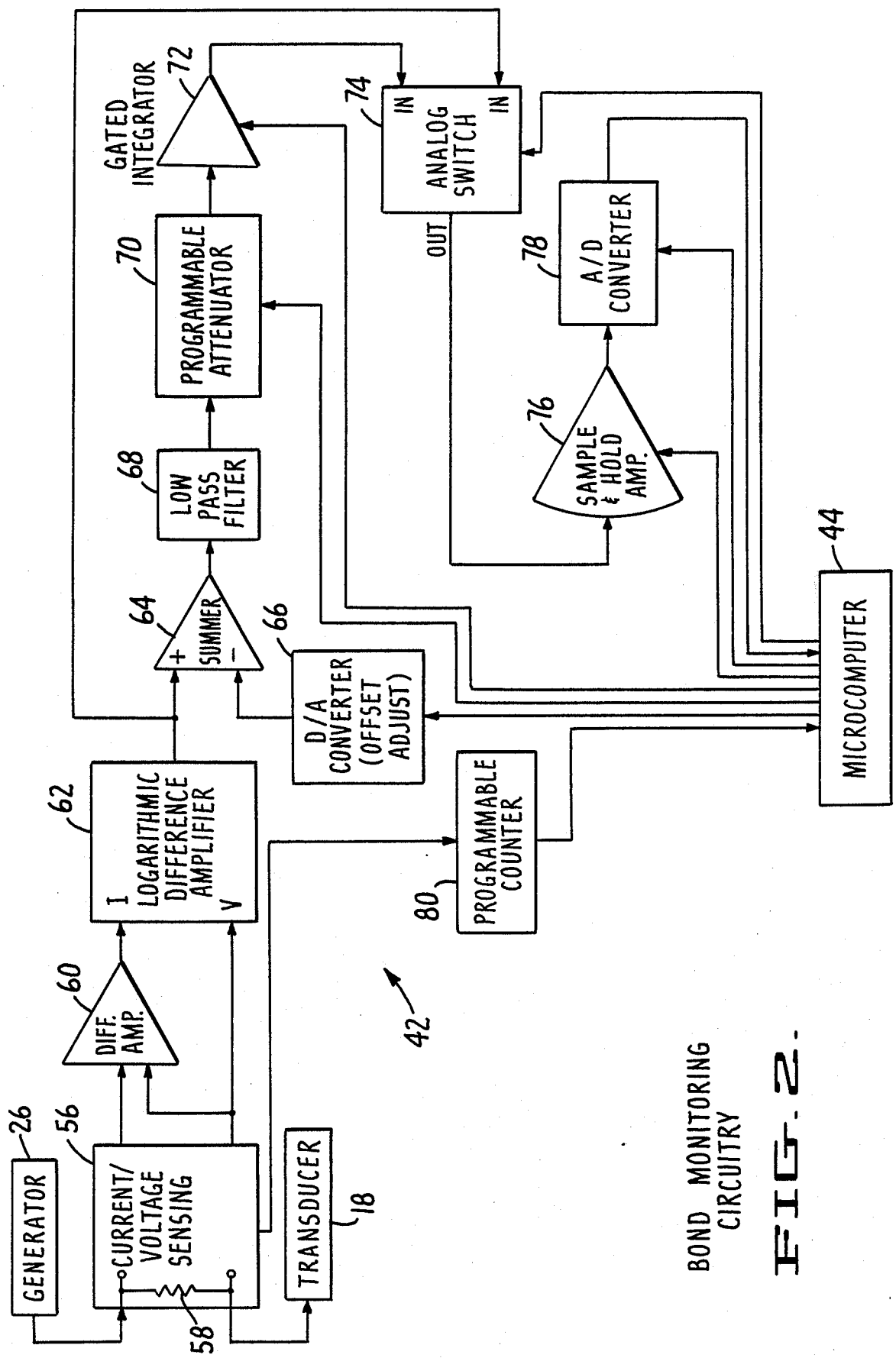
FIG. 2 is a block diagram of bond monitoring circuitry of the preferred embodiment of the bond quality monitor.

Turning now to the analog circuitry of the bond monitoring circuit 42, the overall function of the bond monitoring circuit will first be discussed in relation to FIG. 2, and then the details of the circuit will be discussed in relation to FIGS. 3–7. Connected in series between the generator 26 and the active element 22 of the transducer 18 is a current/voltage sensing and rectifying circuit 56, which includes a current sensing resistor 58 through which the transducer power signal flows between the generator and the transducer. The current/voltage sensing circuit 56 measures the voltage drop across the current sensing resistor 58 to determine the current of the transducer power signal and rectifies the high-frequency component and bypasses the higher frequency harmonics of the transducer power signal. In combination with a differential amplifier 60, the current/voltage sensing circuit 56 supplies to a logarithmic difference amplifier 62 two signals that represent the current and voltage of the transducer power signal. The logarithmic difference amplifier 62 in turn generates an output signal proportional to the logarithm of the impedance of the transducer power signal by subtracting the logarithm of the current thereof from the logarithm of the voltage thereof. The output signal from the logarithmic difference amplifier 62 will be referred to herein as the log impedance signal.

The log impedance signal is supplied to a summer 64, which subtracts therefrom an offset value that represents the quiescent impedance of the transducer 18. The microcomputer 44 supplies to a digital-to-analog converter (DAC) 66 a digital offset value that when converted to an analog voltage by the DAC is equal to the quiescent impedance of the transducer 18. The DAC 66 supplies the analog equivalent of the digital offset value to the summer 64, which in turn subtracts the analog offset value from the log impedance signal.

The quiescent impedance is determined during a calibration procedure by exciting the transducer while the tool 30 is raised out of contact with the bonding pad 36. The microcomputer 44 tries a series of digital offset values during the calibration procedure until a value is found that substantially cancels with the measured log impedance signal to yield a summer output signal that is substantially equal to zero. This digital offset value is stored within the microcomputer 44 and is used during the actual monitoring of bonding operations to subtract the quiescent impedance of the transducer from the log impedance signal.

The offset adjusted signal generated by the summer 64 is supplied to a low pass filter 68, which linearizes and removes some machine vibrational noise from the signal. The low pass filter 68 is adjusted empirically so that, when the bonding machine 10 is producing good bonds, the output signal from the filter stage is preferably substantially constant with time over at least a portion of the bonding operation. When poor quality bonding operations are being performed, the output signals from the filter stage exhibit either a higher or lower voltage throughout that portion of the bonding operation than the output signals obtained during good quality bonding operations. The filtered and linearized output signal from the low pass filter 68 will be referred to herein as a "synthesized signal."

The filtered and linearized synthesized signal from the low pass filter 68 is then supplied through a programmable attenuator 70 to a gated integrator 72. The programmable attenuator 70 attenuates the signal supplied to the gated integrator 72 when necessary to avoid saturating the integrator. The gated integrator 72 integrates the linearized signal over that portion of the bonding operation where the linearized signal is substantially constant when producing good bonds. The time period over which the integration occurs is established by the operator, and is stored in the microcomputer 44. The microcomputer, in turn, supplies timing signals to the gated integrator 72 to define the integration time period. The output signal from the gated integrator 72 will be referred to herein as the integrator signal.

The integrator signal is routed through an analog switch 74 to a sample and hold amplifier 76. At the end of the integration time period, the microcomputer 44 commands the sample and hold amplifier 76 to lock onto the analog voltage of the integrator signal, which permits an analog-to-digital converter (ADC) 78 to convert that analog voltage to a digital value. This digital value, referred to herein as the bond value, is then supplied to the microcomputer 44 for use in the subsequent determination of relative bond quality. The computation of the relative bond quality will be described below in relation to the operation of the programmed microcomputer 44.

While according to the illustrated embodiment, the synthesized signal is preferably constant with time over the integration time period, the synthesized signal need not be constant in order for the bond quality monitor 40 to function properly. What is necessary is that the magnitude of the synthesized signal be distinguishable throughout the integration time period between bonding operations wherein good quality bonds are produced and bonding operations wherein poor quality bonds are produced. The exact shape or precise magnitude of the synthesized signal waveform is not critical, but it is important, whatever the waveform shape, that during the integration time period the synthesized signals obtained during poor quality bonding do not cross over the synthesized signals obtained during good quality bonding. Cross overs are to be avoided because the synthesized signals are integrated throughout the integration time period to determine the bond values. If a synthesized signal from a poor quality bond were to cross over the synthesized signal for a good quality bond, the resulting bond value might not be distinguishable from that of a good quality bond, which would allow the poor quality bond to slip by undetected. Waveforms having substantially constant magnitude or slope are preferred, while oscillating waveforms are disfavored due to the possibility of cross overs during the integration time period.

The analog switch 74 may alternatively be commanded by the microcomputer 44 to supply the log impedance signal to the sample and hold amplifier 76 instead of the integrator signal. In such a case, the ADC 78 converts the log impedance signal into its digital equivalent to supply the microcomputer 44 with a direct measurement of the impedance of the transducer 18 for communication to the operator.

The current/voltage sensing circuit 56, in addition to monitoring the voltage and current of the transducer power signal, also assists in monitoring the frequency of the transducer power signal. Circuit 56 supplies a square wave signal, equal in frequency to the transducer power signal, to a programmable counter 80. The programmable counter 80 counts the pulses of the square wave signal for a predetermined length of time and supplies the count to the microcomputer, which converts the count into units of cycles per second for display to the operator.

Figure 3:
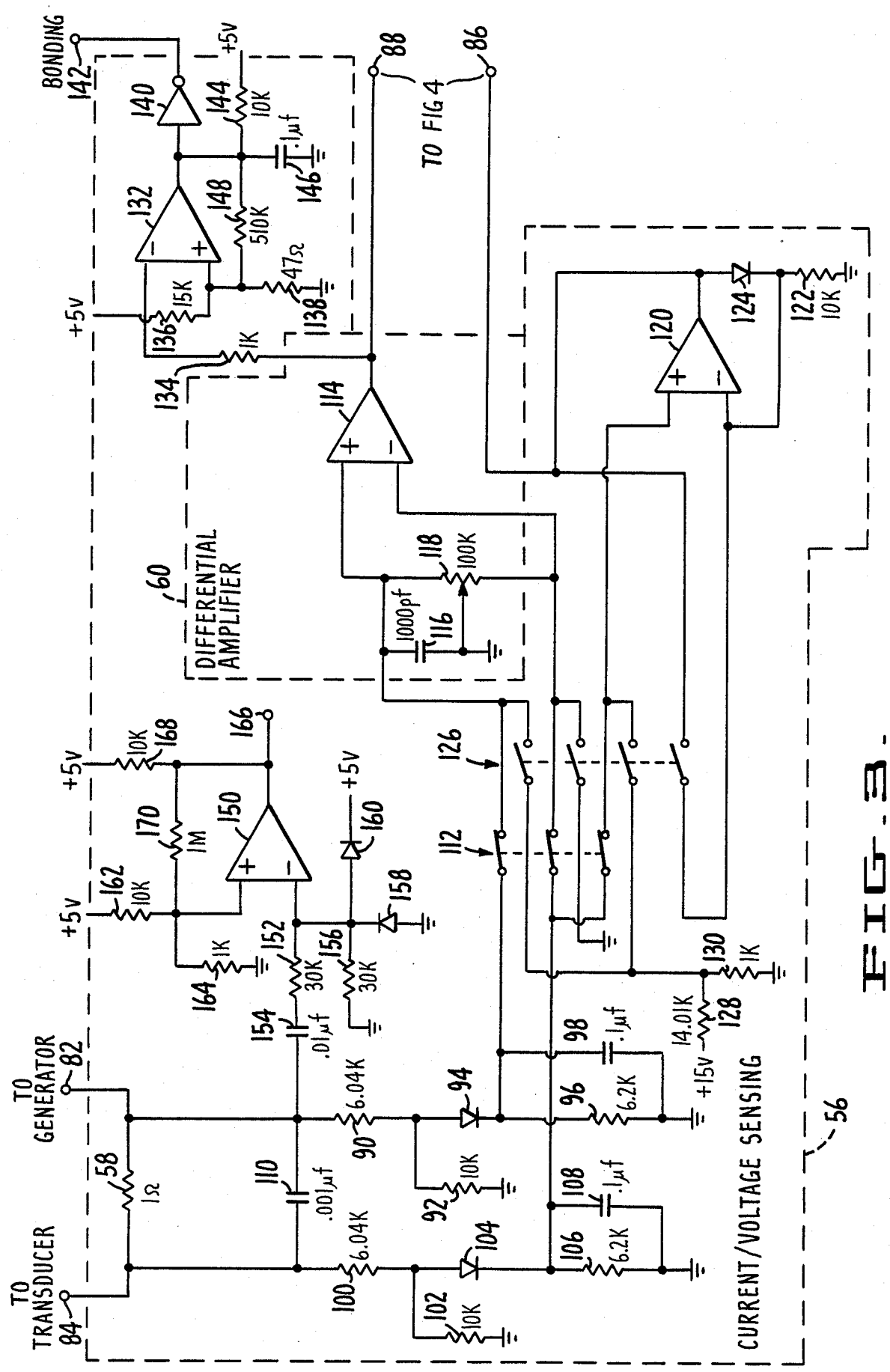
FIG. 3 is a schematic diagram of current/voltage sensing circuitry and a differential amplifier of the preferred embodiment of the bond quality monitor.

With the above overview in mind, the details of the bond monitoring circuit 42 will now be discussed, with attention first to the current/voltage sensing circuit 56. As shown in FIG. 3, the current sensing resistor 58 is connected between node 82, which is coupled to the generator 26, and node 84, which is coupled to the transducer 18. The voltage at node 84 is equal to the voltage of the transducer power signal, while the voltage drop between nodes 82 and 84 divided by the resistance of resistor 58 is equal to the current of the transducer power signal. The resistance of resistor 58 is preferably low in value, such as one ohm, in order to minimize the energy that the resistor dissipates. It is the task of the current/voltage sensing circuit 56 and the differential amplifier 60 to supply to the logarithmic difference amplifier 62 one signal that is representative of the voltage of the transducer power signal and another signal that is representative of the current of the transducer power signal. These signals do not represent the instantaneous voltage and current of the AC transducer power signal, but rather represent time averaged values. The signals are found at nodes 86 and 88, respectively.

More specifically, the current/voltage sensing circuit 56 includes two resistor ladders for downwardly rectifiers or detectors for rectifying the sensed signals. Coupled to node 82 is one resistor ladder consisting of resistors 90 and 92 coupled between node 82 and ground, and one rectifier consisting of a diode 94 coupled at its anode terminal to the common connection between resistors 90 and 92 and coupled at its cathode terminal to ground through parallel connected resistor 96 and capacitor 98. Coupled to node 84 is the other resistor ladder consisting of resistors 100 and 102 coupled between node 84 and ground, and the other rectifier consisting of a diode 104 coupled at its anode terminal to the common connection between resistors 100 and 102 and coupled at its cathode terminal to ground through parallel connected resistor 106 and capacitor 108. A filter capacitor 110 is coupled in parallel with resistor 58 across the nodes 82 and 84 for bypassing the higher frequency harmonics of the sensed signals. The component values listed in the illustrated preferred embodiment were chosen for a transducer power signal having a frequency of about sixty KHz and a transducer quiescent impedance in the range of ten to forty ohms. Resistors 90, 92, 100, and 102 can be easily changed if transducers of other impedances or power levels are employed in conjunction with the invention.

Figure 7:
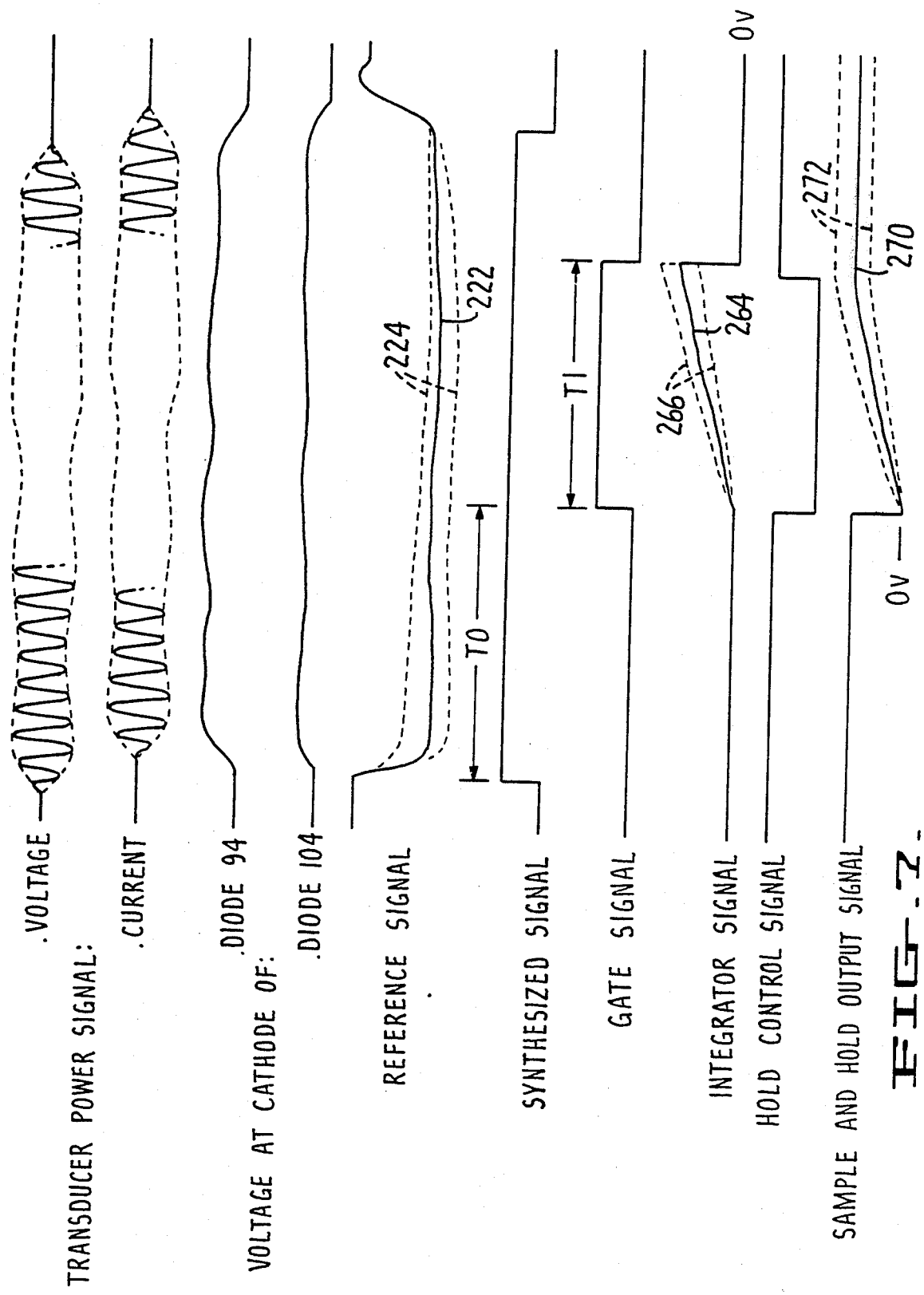
FIG. 7 is a series of graphs of signals present throughout the preferred embodiment of the bond quality monitor.

The voltage and current of the transducer power signal at node 82 are shown in FIG. 7 in graphical form. Both are high-frequency sine waves, with the current envelope lagging slightly behind the voltage envelope The circuitry of the current/voltage sensing circuit 56, in effect, demodulates the sine waves to reconstruct the positive components of the envelopes of the voltage and current waveforms. Due to the charge storage in capacitors 98 and 108, the voltages at the cathodes of diodes 94 and 104 are proportional to the DC peak voltages at the nodes 82 and 84, respectively, as shown in FIG. 7. The voltage at the cathode of diode 94 is slightly higher than that at the cathode of diode 104 due to the voltage drop across the current sensing resistor 58.

The signals present at the cathodes of diodes 94 and 104 are supplied through a switch 112 to the differential amplifier 60. The cathode of diode 94 is coupled through switch 112 to the non-inverting input terminal of an instrumentation amplifier 114, while the cathode of diode 104 is coupled through switch 112 to the inverting input terminal of the instrumentation amplifier. A capacitor 116 is coupled between the non-inverting input terminal and ground, while an adjustable resistor 118 is coupled across the two input terminals with the wiper connected to ground. The output terminal of amplifier 114 is connected through node 88 to the logarithmic difference amplifier 62 (see FIG. 4). The amplifier 114, in effect, subtracts the voltage at the cathode of diode 104 from the voltage at the cathode of diode 94 to generate an output signal having a voltage that corresponds to the voltage drop across the current sensing resistor 58, and, thus, corresponds to the current of the transducer power signal.

The capacitor 116 and resistor 118 are necessary for the proper operation of the preferred embodiment. It is believed that they compensate for the parasitic capacitance of the instrumentation amplifier 114. To set the resistance of the resistor 118, the bond quality monitor 40 is coupled to a transducer that is removed from the bonding machine 10 and the resistor 118 is adjusted until the measured log impedance corresponds to the actual impedance of the transducer as determined by a separate impedance measuring instrument or procedure. It has been found that the wiper of the resistor 118 is properly located near the center of the resistor.

The signal present at the cathode of diode 104 is also supplied through the switch 112 to the non-inverting input terminal of an operational amplifier 120. The inverting input terminal of the operational amplifier 120 is coupled to ground through a resistor 122 and is coupled to the output terminal thereof through a diode 124. The output terminal is also coupled through node 86 to supply a voltage that corresponds to the voltage of the transducer power signal to the logarithmic difference amplifier 62. The diode 124 is preferably matched to diode 104 so as to compensate for the voltage drop across diode 104.

The input terminals of the amplifiers 114 and 120 are also coupled through a switch 126 to various known voltages for purposes of calibration, in which case switch 112 is opened. The non-inverting input terminals of both amplifiers 114 and 120 are coupled through switch 126 to a voltage divider formed by resistors 128 and 130, which are coupled between a source of DC voltage and ground. When switch 126 is closed, the inverting input terminal of amplifier 114 is connected to ground, while the inverting input terminal of amplifier 120 is connected to its output terminal.

The output terminal of amplifier 114 is utilized, in addition to supplying a signal representing the current of the transducer power supply to the logarithmic difference amplifier 62, for generating a bonding signal that indicates when the transducer power signal is energized. The output terminal of amplifier 114 is coupled to the inverting input terminal of a voltage comparator 132 through a resistor 134, while the non-inverting input terminal of the voltage comparator is coupled to a constant voltage supplied by a voltage divider formed by resistors 136 and 138, which are coupled between a source of DC voltage and ground. The output terminal of the comparator 132 is coupled through an inverter 140 to node 142 and is also coupled to a filter composed of resistor 144 coupled to a source of DC voltage, capacitor 146 coupled to ground, and resistor 148 coupled to the junction between resistors 136 and 138. When the output signal of the differential amplifier 60 is above ground potential, which occurs when the transducer power signal is energized, the comparator 132 supplies a logic low signal to the inverter 140, which inverts the signal to a logic high signal. The bonding signal is shown in FIG. 7.

A voltage comparator 150 of the current/voltage sensing circuit 56 is utilized for generating a square wave signal at the frequency of the transducer power signal for clocking the programmable counter 80. The inverting input terminal of the voltage comparator 150 is coupled through a resistor 152 and capacitor 154 to node 82, through a resistor 156 to ground, and through clamping diodes 158 and 160 to ground and a source of DC voltage, respectively. The non-inverting input terminal of the comparator 150 is coupled to a voltage divider composed of resistors 162 and 164 that are coupled between a source of DC voltage and ground. The output terminal of the comparator 150, which supplies the square wave signal through node 166 to the programmable counter 80, is also coupled to the source of DC voltage through a resistor 168 and to the non-inverting input terminal thereof through a feedback resistor 170.

As described above, the current/voltage sensing circuit 56 and the differential amplifier 60 supply to the logarithmic difference amplifier 62 through nodes 86 and 88 two signals having voltages that correspond respectively to the peak voltage and peak current of the transducer power signal. The logarithmic difference amplifier 62, in turn, generates a log impedance signal that corresponds to the logarithm of the impedance of the transducer 18 by subtracting the logarithm of the current signal (at node 88) from the logarithm of the voltage signal (at node 86). Such a computation yields the logarithm of the impedance because the logarithm of a quotient (Z=V/I) is equal to the logarithm of the dividend (V) minus the logarithm of the divisor (I).

Figure 4:
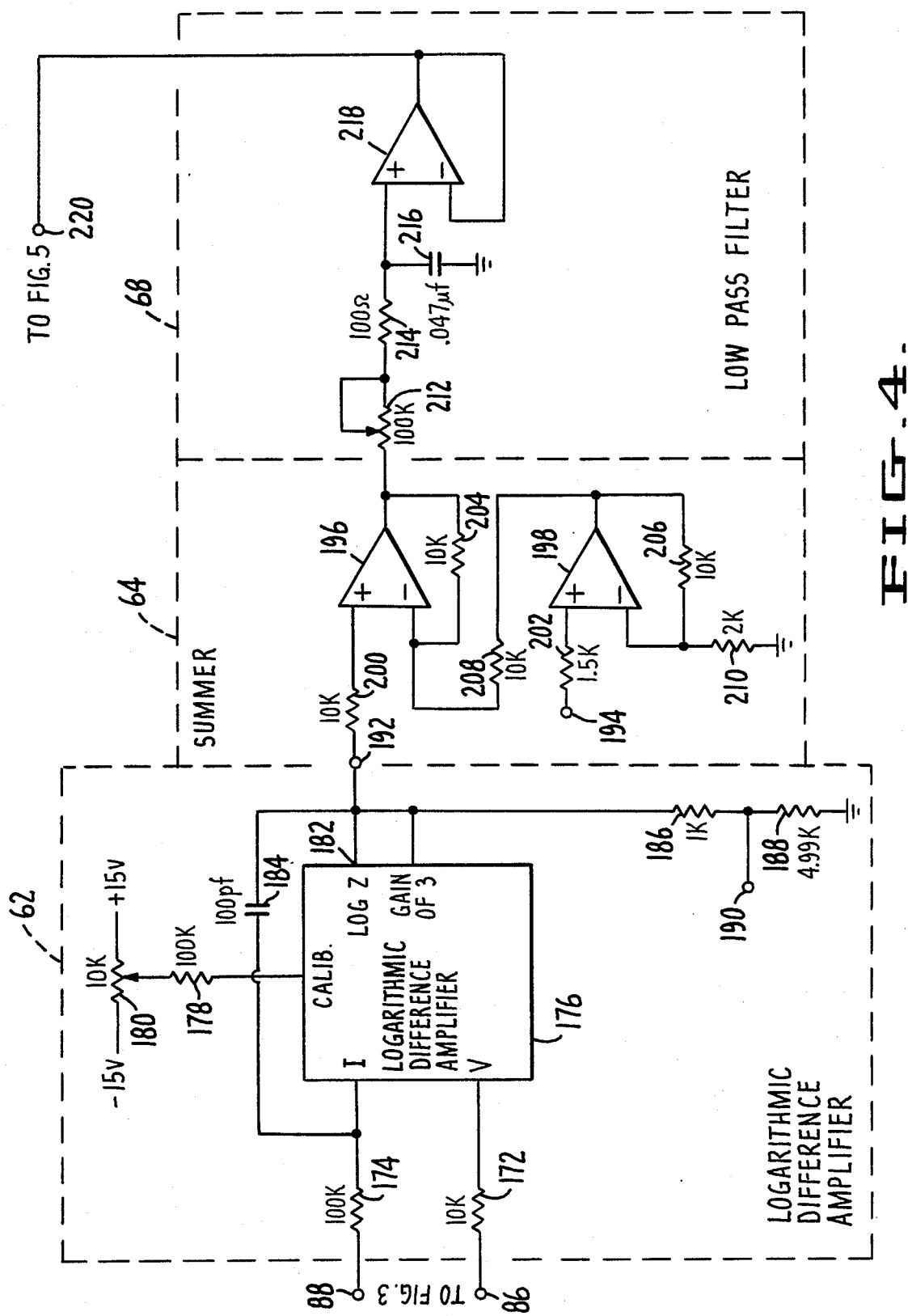
FIG. 4 is a schematic diagram of a logarithmic difference amplifier, a summer, and a low pass filter of the preferred embodiment of the bond quality monitor.

As shown in FIG. 4, the voltage signal is supplied through node 86 and resistor 172 to the dividend input terminal, while the current signal is supplied through node 88 and resistor 174 to the divisor input terminal. Since in the illustrated preferred embodiment, the input terminals of the logarithmic difference amplifier device 176 require input currents instead of input voltages, the resistors 172 and 174 convert the voltages at nodes 86 and 88 into corresponding currents. A calibration terminal of the logarithmic difference amplifier device 176 is coupled through resistor 178 to the wiper of an adjustable resistor 180 that is coupled between plus and minus DC voltages. During calibration, equal currents are supplied to the input terminals of the device 176 and the adjustable resistor 180 is adjusted so that the output terminal 182 is at zero volts. The output terminal 182 is coupled back to the divisor input terminal through a capacitor 184, and is coupled to ground through a voltage divider consisting of resistors 186 and 188, which supply the log impedance signal at a reduced voltage to node 190 for connection to the analog switch 74. In the illustrated preferred embodiment, the output terminal 182 is also coupled back to the device 176 to select a gain of three for the output signal.

The log impedance signal is supplied from the output terminal 182 of the logarithmic difference amplifier device 176 to the non-inverting input terminal 192 of the summer 64. The inverting input terminal 194 of the summer 64 receives the analog offset signal from the digital-to-analog converter 66, which is equivalent to the quiescent impedance of the transducer 18. The summer 64 is realized in circuit form by two operational amplifiers 196 and 198. Amplifier 196 has its non-inverting input terminal coupled through a resistor 200 to the non-inverting input terminal 192 of the summer 64, while amplifier 198 has its non-inverting input terminal coupled through a resistor 202 to the inverting input terminal 194 of the summer 64. The output terminals of amplifier 196 and 198 are coupled back to their corresponding inverting input terminals through resistors 204 and 206, respectively. The inverting input terminal of amplifier 196 is coupled through a resistor 208 to the output terminal of amplifier 198, while the inverting input terminal of amplifier 198 is coupled to ground through a resistor 210. In operation, the summer 64 subtracts the quiescent impedance of the transducer 18 from the log impedance signal so that the resultant signal, which is supplied to the low pass filter 68, is a reflection of the actual bonding operation, but not the latent characteristics of the transducer.

The output signal from the summer 64, which equals the log impedance signal minus the offset value, is supplied to the low pass filter 68 for linearization and removal of machine vibrational noise. The low pass filter 68 includes a filter composed of resistors 212 and 214 and capacitor 216, and a voltage follower composed of an operational amplifier 218. Resistors 212 and 214 are coupled in series between the output terminal of amplifier 196 of the summer 64 and the non-inverting input terminal of the amplifier 218. The capacitor 216 is coupled between the non-inverting input terminal of the amplifier 218 and ground. The amplifier 218 is configured as a voltage follower, with its output terminal coupled back to its inverting input terminal, and with its output terminal coupled through node 220 to supply a synthesized signal to the programmable attenuator 70.

The purpose of the low pass filter is to linearize the log impedance signal prior to the integration step. Resistor 212 is an a that is adjusted empirically so that the synthesized signal is preferably substantially constant i.e., having a zero slope, over at least a portion of the bonding operation when the bonding machine 10 is producing good quality bonds. The synthesized signal 222 for a good quality bond is shown in FIG. 7 as having a fairly constant value over most of the duration of the bonding operation. The filter is also adjusted so that when the bonding machine is performing poorly for any reason, such as a missing wire, a dirty bonding pad, too much energy, etc., the synthesized signals in such cases do not cross over for a synthesized signal for a good bond within the time window for the integration. Two such synthesized signals 224 for poor quality bonds are shown in dashed lines in FIG. 7. Note that the synthesized signal 224 for a poor quality bond differs from that for a good quality bond to a greater degree during the earlier stages of the bonding operation than during the later stages.

It would seem preferable that, in order to maximize the accuracy of the bond quality monitor 40, the start of the integration time period should be at the beginning of the bonding operation. In actuality, however, it is preferable to start the integration time period after a short delay so as to avoid variations in the measured impedance caused by vibrations when the transducer and bonding wire contacts the bonding pad 36. For a time period defined by a time TO, the start of the integration time period is delayed to allow these vibrations to die out. Also, it is preferable to delay the start of the integration time period because of unpredictable variations in parameters such as the degree of tool interlocking with the bonding wire, the static friction between the bonding wire and bonding pad, and the possibility of transducer bouncing. In order to minimize the effects of these variable parameters, the integration is delayed by the time TO, which usually varies from five to ten milliseconds, after the bonding operation begins.

In order to maximize the accuracy of the bond quality monitor, the integration time period should be as long as possible. The optimum integration time period is primarily a function of the specific bonding machine model and wire size.

Figure 5:
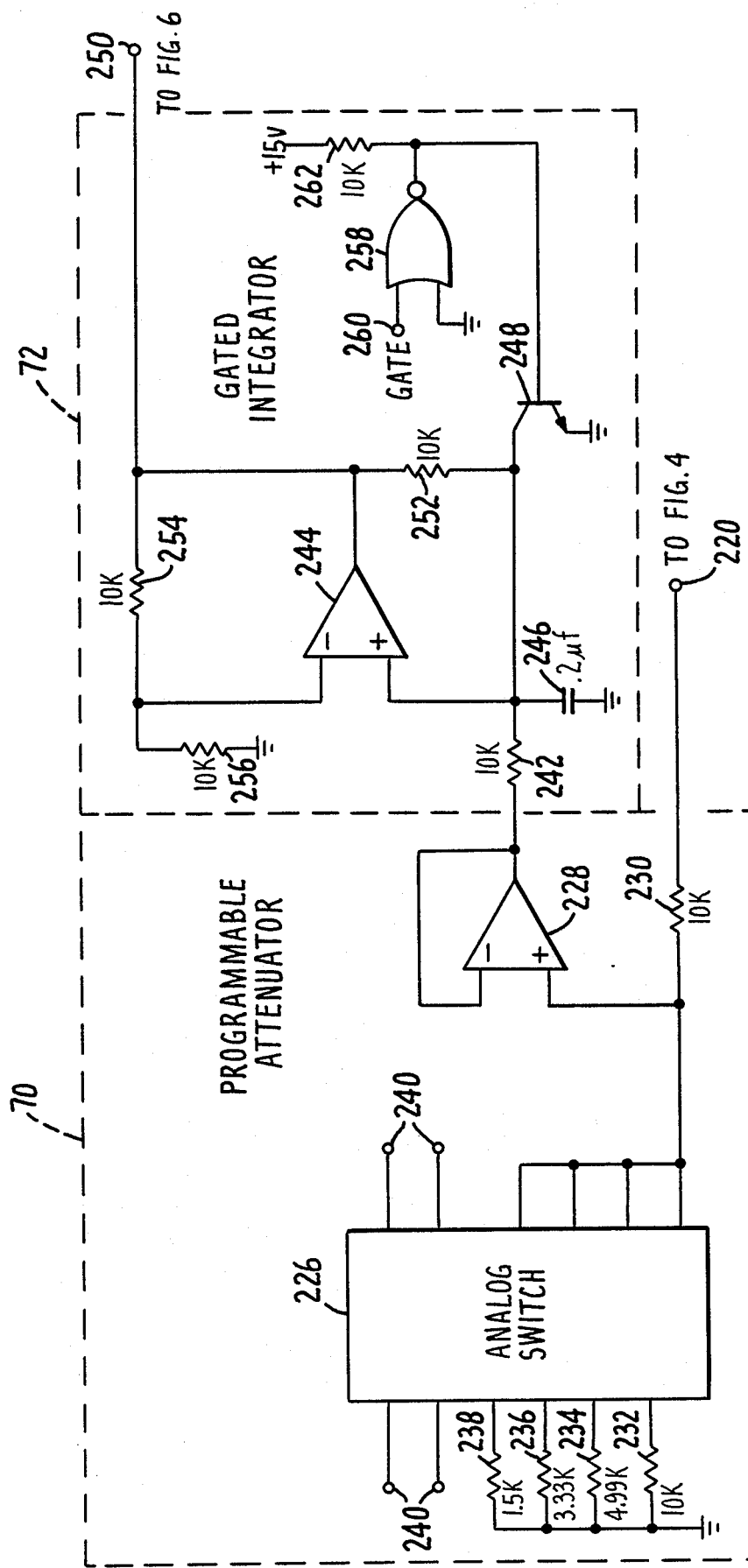
FIG. 5 is a schematic diagram of a programmable attenuator and a gated integrator of the preferred embodiment of the bond quality monitor.

The circuitry of the programmable attenuator 70 and the gated integrator 72 is shown in FIG. 5. The programmable attenuator 70 includes an analog switch 226, a voltage follower 228, and resistors 230, 232, 234, 236, and 238. Resistor 230 is coupled between node 220, which receives the reference signal from the low pass filter 68, and all four input terminals of the analog switch 226. Resistors 232, 234, 236 and 238 are each coupled between separate output terminals of the analog switch 226 and ground. Four control input terminals of the analog switch are coupled through nodes 240 to the microcomputer 44. The voltage follower 228 comprises an operational amplifier with its non-inverting input terminal connected to the common connection between resistor 230 and the input terminals of the analog switch 226, and with its output terminal coupled back to its inverting input terminal. The analog switch 226, upon command received from the microcomputer 44 through nodes 240, selectively connects some combination of between none and four of the resistors 232, 234, 236, and 238 to the input terminal of the analog switch to establish a voltage divider for the input terminal of the voltage follower 228. This "programmed" voltage divider attenuates the voltage applied to the voltage follower 228.

The purpose of the programmable attenuator 70 is to selectively attenuate the synthesized signal so that the gated integrator 72 does not saturate during the integration of the synthesized signal for any operating condition, including poor quality bonds. In order to establish the proper attenuation factor, the microcomputer 44 first selects a minimal attenuation, i.e., with all four resistors 232-238 disconnected, and gradually increases the attenuation while producing good quality bonds until the measured bond value is about one half of the range of the analog-to-digital converter 78. Once calibrated, the attenuation factor is fixed throughout the operation of bond quality monitor 40.

Figure 6:
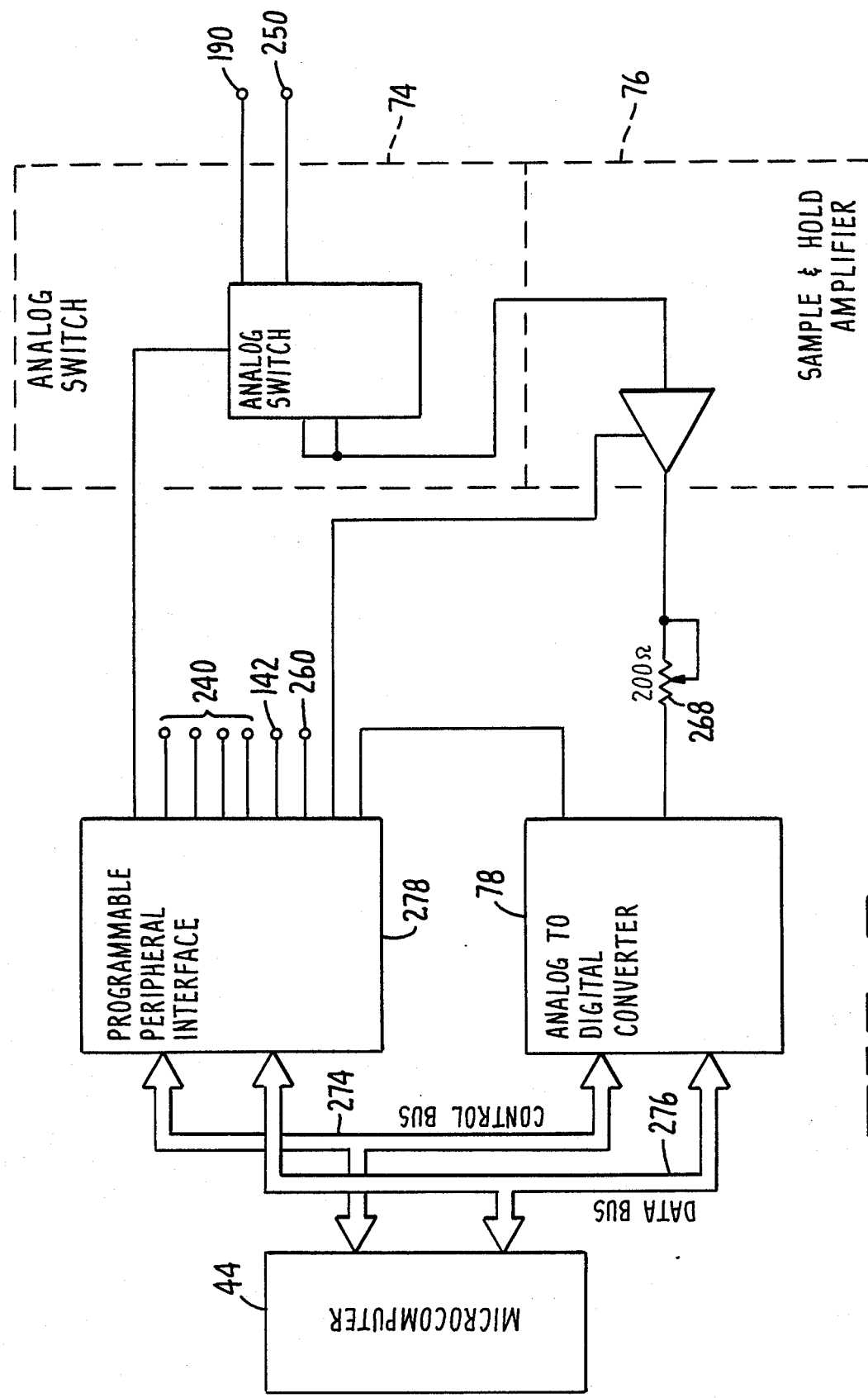
FIG. 6 is a schematic diagram of an analog switch, a sample and hold amplifier, and a peripheral interface of the preferred embodiment of the bond quality monitor.

In the next stage., the gated integrator 72 integrates the attenuated synthesized signal for a time period beginning after TO milliseconds have elapsed from the beginning of the bonding operation and continuing for TI milliseconds. The attenuated synthesized signal is supplied through a resistor 242 to the non-inverting input terminal of an operational amplifier 244, which is also coupled to ground through a capacitor 246 and connected to the collector of an NPN transistor 248. The output terminal of the amplifier 244 supplies the integrator signal through node 250 to the analog switch 74 (FIG. 6). The output terminal of the amplifier 244 is also coupled through a resistor 252 to its non-inverting input terminal and is coupled through a resistor 254 to its inverting input terminal, which is also coupled to ground through a resistor 256. The emitter of the transistor 248 is grounded, while the base is driven by a logic signal generated by a NOR gate 258. One input terminal of the NOR gate 258 is grounded, while the other input terminal receives a gate signal from the microcomputer 44 through node 260. The output terminal of the NOR gate 258 is connected to the base of the transistor 248 and is coupled through a resistor 262 to a source of positive DC voltage.

When the gate signal, shown in FIG. 7, is at its logic low voltage, a positive voltage is applied to the base of the transistor 248, thus turning on the transistor and effectively grounding the input to the gated integrator 72. The microcomputer 44 sets the gate signal at its logic high voltage to begin the integration time period after TO milliseconds have elapsed from the beginning of the bonding operation, which is signified by the rising edge of the bonding signal. When the gate signal goes high, the output of the NOR gate goes low, thus turning off the transistor 248 and allowing the integrator to begin its process of integration. The microcomputer 44 keeps the gate signal high until TI milliseconds have elapsed, whereupon the microcomputer resets the gate signal low to end the integration time period. During the integration time period, the integrator signal continuously increases in amplitude, and, assuming that the reference signal is substantially constant during the time period, the increase is substantially linear. As shown in FIG. 7, the integrator signal for a good bond 264 ends up at a different final voltage than that for a poor bond 266. This difference is due to the differences between the reference signals 222 and 224 for the two cases.

The analog switch 74, shown in FIG. 6, permits either the integrator signal or the log impedance signal to be supplied to the microcomputer 44 through the sample and hold amplifier 76 and the analog-to-digital converter (ADC) 78. The analog switch 74 receives the integrator signal through node 250 and the log impedance signal through node 190, and is operable for coupling either of those two signals to the input terminal of the sample and hold amplifier 76. A select signal from the microcomputer selects which of the two signals is to be supplied to the sample and hold amplifier 76.

The sample and hold amplifier 76 receives a signal from the analog switch, receives a hold control signal from the microcomputer 44, and supplies an output signal through an adjustable resistor 268 to an input terminal of the ADC 78. When the hold control signal is at its logic low state, which occurs during the integration time period, the output signal of the amplifier 76 follows the voltage of the input signal. The hold control signal remains low during the integration time period, so that the sample and hold amplifier 76 tracks the voltage of the integrator signal during that time, assuming that the analog switch has selected the integrator signal for connection to the sample and hold amplifier. When the integration time period ends, the hold control signal is set to its logic high state, thus signalling the sample and hold amplifier to hold its output at the same voltage as the input signal at the end of the integration time period. FIG. 7 illustrates the waveform of the output signal of the sample and hold amplifier, with voltage 270 corresponding to the peak of the integrator signal 264 for a good quality bond, and with voltage be 272 corresponding to the peak of the integrator signal 266 for a poor quality bond.

The sample and hold amplifier 76 gives the analog-to-digital converter (ADC) 78 time to complete its conversion of the peak of the integrator signal into a digital value. The microcomputer 44 enables the ADC 78 to begin its conversion once the integration time period has expired. Once the conversion has been accomplished, the ADC 78 notifies the microcomputer via a control bus 274 and then communicates the result to the microcomputer via a data bus 276.

The interface between the circuitry of the bond monitoring circuit 42 and the microcomputer 44 is preferably a programmable peripheral interface 278. The attenuator control signals are supplied to the programmable attenuator through nodes 240, the gate signal is supplied to the gated integrator 72 through node 260, and the bonding signal to conveyed back to the microcomputer from the current/voltage sensing circuit 56 through node 142. The digital-to-analog converter 66 and the programmable counter 80 are also coupled to the microcomputer via the programmable peripheral interface 278. The programmable peripheral interface 278 is coupled to the microcomputer via the control and data buses 274 and 276, respectively, by means commonly known in the art. Preferably, the microcomputer is implemented with an Intel 8085 microprocessor, and the programmable peripheral interface is implemented with an Intel 8255 device. Due to the conventional design and implementation of the microcomputer 44 and its interfaces to the bond monitoring circuit 42 and the operator, it would be inappropriate to set forth in detail the circuitry of the microcomputer. The following discussion of the manner of programming the microcomputer 44 to accomplish its control and computational functions will suffice to disclose that aspect of the present invention.

The bond quality monitor 40 operates in one of three modes: idle, gather, and run. In idle mode, the adjustable parameters of the bond quality monitor 40 can be set through various calibration procedures, as mentioned above. Also in idle mode, the impedance and frequency of the transducer power signal can be monitored and displayed to the operator. In gather mode, the bond quality monitor 40 builds its data base of bond values for good quality bonds prior to entering into the run mode. In run mode, the bond quality monitor 40 continuously monitors the quality of the bonding operations by measuring and computing a bond value for each bonding operation and comparing that bond value to the data base of prior bond values for good quality bonds.

Figure 8:
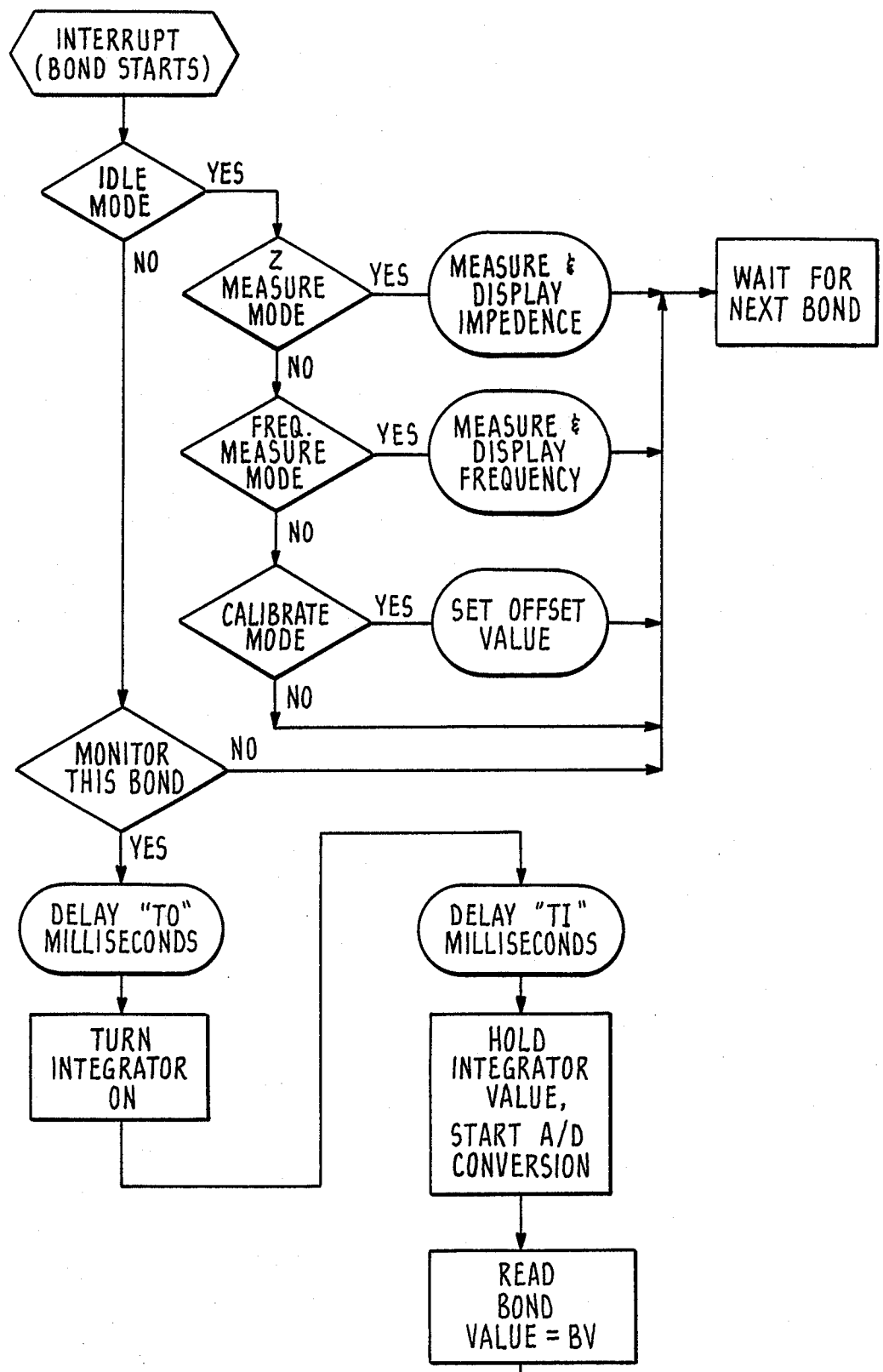
FIG. 8 is a flow chart of one portion of the operation of a programmed microcomputer of the preferred embodiment of the bond quality monitor.
Figure 9:
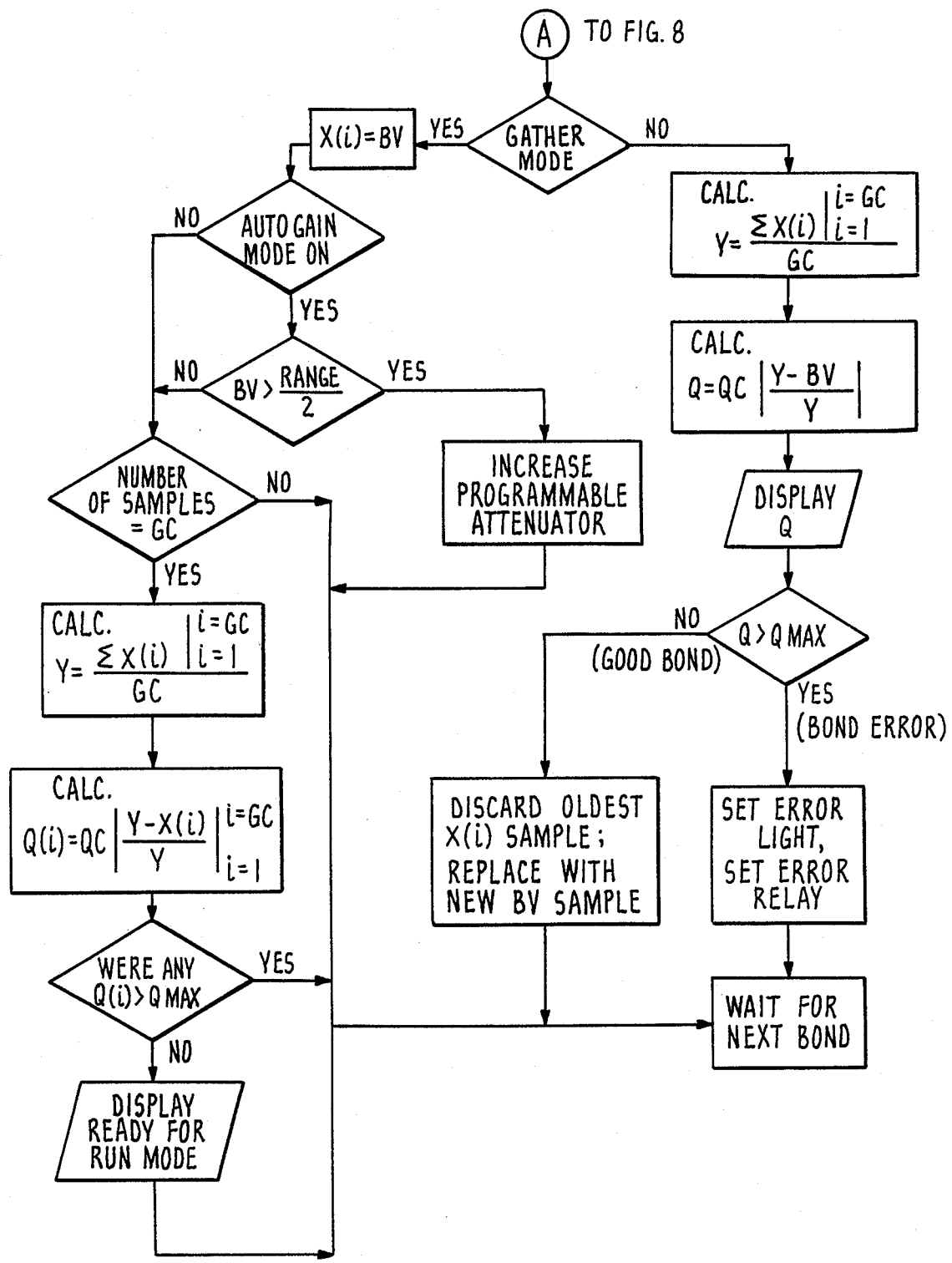
FIG. 9 is a flow chart of the remaining portion of the operation of the programmed microcomputer of the preferred embodiment of the bond quality monitor.

In reference now to FIGS. 8 and 9, the operation of the programmed microcomputer 44 is shown in flow chart form. The program executed by the microcomputer 44 takes action when bonding starts, as triggered by the bonding signal generated by the current/voltage sensing circuit 56. First the program tests whether the idle mode has been selected by the operator. If yes, the program then tests whether the operator has requested to measure the impedance of the transducer, to measure the frequency of the transducer power signal, or to determine the offset adjustment for the quiescent impedance of the transducer. If the impedance of the transducer is to be measured, the program instructs the circuitry of the microcomputer to direct the analog switch 74 to route the log impedance signal to the ADC 78 and the display interface 46 of the microcomputer 44 to relay the result to the display 48. Similarly, if the frequency of the transducer power signal is to be measured, the program instructs the circuitry of the microcomputer to compute the frequency from the data supplied by the programmable counter 80 and to display the result. If the offset value is to be determined, the operator moves the transducer 18 to a position out of contact with the bonding pad, and the program instructs the generator to excite the transducer, and instructs the bond monitoring circuit to adjust the offset value until the output signal of the summer 64 is substantially equal to zero volts. Also during the idle mode, the operator can also select various operational parameters such as TO, TI, GC, Qmax, and QG, which will be defined below. Once any of the above tasks have been completed, the program waits for the next bonding operation to begin.

If the operator has selected either the gather mode or run mode of operation, the program will direct the circuitry of the microcomputer 44 and the bond monitoring circuit 42 to monitor the bonding operation. Once the bonding operation starts, as denoted by the bonding signal, the program directs the microcomputer to delay TO milliseconds and to then generate the gate signal that turns on the gated integrator 72. The integration process continues for TI milliseconds, whereupon the program directs the sample and hold amplifier 76 to lock onto the peak value of the integrator signal and directs the ADC 78 to start its conversion of that peak value into a digital value. Once the conversion is complete, the program directs the microcomputer to read the digital bond value (BV) from the ADC 78 via the data bus 276.

At this point in the operation of the program, a test is performed to determine whether the gather mode or the run mode has been selected by the operator. If the gather mode has been selected, the program directs the microcomputer and bond monitoring circuit to build a data base of bond values for a number of consecutive good quality bonds. During this time, the bonding machine operator must be very careful to set up the bonding machine properly so that good quality bonds are produced. Also during this time, it is advisable to perform pull tests on the bonds to verify their quality.

The first step in the operation of the program in gather mode is to store the just measured bond value into one element, X(i), of an array, X. Then, the program tests to determine whether the auto gain mode has been selected by the operator, and if so, tests the bond value to determine whether it exceeds one half of the range of the ADC 78. If yes, then the program directs the programmable attenuator 70 increase the attenuation factor, and then waits for the next bonding operation to again determine whether the attenuation factor is sufficiently high. If the auto gain mode is off or of the bond value is less than half of the range of the ADC 78, then the number of samples is tested to determine whether enough samples have been obtained. The number of consecutive good quality bonding samples required to complete the gather process is equal to GC (gather count). If the number of samples obtained so far is less than GC, then the program waits for the next bonding operation to take another sample.

Once a number of samples equal to GC has been obtained in gather mode, then the program computes a bond value reference equal to the average of the bond values stored in the X array. This average will be referred to as Y. Next, the program computes a quality factor, Q(i) for each of the bond values stored in the X array. Is shown in FIG. 9, the quality factor is calculated for each bond value according to the formula:

$$Q(i) = QC \times |(Y - X(i))/Y|,$$

where i ranges from 1 to GC, and QC is a calibration constant for the quality factor. In other words, the quality factor is equal to the absolute value of the normalized deviation of the bond value from the average of the bond values, times the calibration constant. Next, all of the quality factors are compared to a preselected value, Qmax, which determines the maximum acceptable quality factor. If any of the quality factors exceeds Qmax, the program waits for the next bonding operation and the gather process continues until such time as all quality factors in the data base do not exceed Qmax. This test forces the bond quality monitor 40 to stay in the gather mode until such time as GC good quality bonds have been performed in succession. If none of the quality factors exceed Qmax, then the program informs the operator that the gather mode operation has been completed. The bond quality monitor 40 may then be switched by the operator to the run mode. The values of Qmax and QC are selected so that only bond values measured during good quality bonding are included in the data base of good quality bond values. The value of GC is selected as a compromise between an accurate data base and minimizing the time spent in gather mode. It is expected the values of GC in the range from ten to twenty will be the most practical compromise.

Once the gather mode operation has been completed, there exists in the X array bond values for a number of consecutive good quality bonds, where that number is equal to the gather count, GC. Now the bond quality monitor 40 is ready to monitor bonding operations for their quality relative to the bonds performed during the gather process. In run mode, after a bond value, BV, has been measured for a particular bonding operation, the bond value average, Y, is recomputed by the programmed microcomputer from the data base of bond values stored in the X array, and a quality factor, Q, is computed for the just measured bond value. As before, the quality factor, Q, is equal to QC multiplied by the absolute value of the quantity Y minus BV divided by Y. Next, the program directs the microcomputer to display the calculated quality factor to the operator, and tests whether the quality factor is greater than Qmax. If yes, the bonding operation just performed has deviated too much from the average, and is thus suspect of having produced a poor quality bond. In such case, the program directs the display to alert the operator by flashing an error indicator, and, optionally, provides a relay output signal that can be utilized to shut down the bonding machine 10 so that no more suspect bonds can be produced.

If the measured bond value, BV, does not exceed Qmax, then the bond is deemed to have been a good quality bond. In such case, the oldest bond value in the X array is discarded and is replaced by the just measured bond value. In this manner, the data base of bond values is continually updated to reflect gradual changes in the measured impedance of the transducer due to changing bonding parameters that have only an insignificant effect on bond quality. Once the data base is updated, the program waits to monitor the next bonding operation as it occurs.

From the above description, it will be apparent that the invention disclosed herein provides a novel and advantageous apparatus and method for monitoring and analyzing the quality of the ultrasonic wire bonding process. The foregoing discussion discloses and describes merely exemplary methods and embodiments of the present invention. As will be understood by those familiar with the art, the invention may be embodied in other specific forms without departing from the spirit or essential characteristics thereof. For example, other methods of computing a quality factor or for testing the bond value against the data base of prior bond values could be performed, but would remain within the scope of the invention. Also, other means for generating the substantially constant impedance function, or other means for computing the bond values could be used instead of the particular means disclosed herein. Accordingly, the disclosure of the present invention is intended to be illustrative, but not limiting, of the scope of the invention, which is set forth in the following claims.

What is claimed is:

1. An apparatus for monitoring the quality of bonding operations performed by an ultrasonic bonding machine, wherein the bonding machine includes an ultrasonic generator that generates a transducer power signal for exciting an ultrasonic transducer to perform each bonding operation, said apparatus comprising:

sensing means for measuring the current and voltage of the transducer power signal during a bonding operation;

signal processing means for combining and filtering the measured current and voltage of the transducer power signal to generate a synthesized signal that is indicative of the logarithm of the impedance of the transducer during bonding;

means for establishing an integration time period starting after the bonding operation begins and ending before the bonding operation ends;

integration means for integrating said synthesized signal over said integration time period to obtain a bond value indicative of the quality of that particular bond; and data processing means for comparing said bond value to prior bond values obtained during prior acceptable bonding operations, and for indicating a poor quality bond if the current bond value deviates from the prior bond values by greater than a predetermined value.

2. An apparatus as recited in claim 1 wherein the transducer power signal is an alternating current signal, and wherein said sensing means includes means for rectifying the transducer power signal and said signal processing means includes means for combining and filtering the transducer power signal to generate the synthesized signal.

3. An apparatus as recited in claim 1 wherein said data processing means includes means for determining the degree of acceptability of a particular bond by computing the deviation of the current band value from an average of said prior bond values.

4. An apparatus as recited in claim 1 wherein said prior bond values initially include bond values from a preselected number of consecutive bonding operations each of which has produced good quality bonds, and wherein said prior bond values are continually updated by discarding the oldest prior bond value and replacing it with the current bond value each time a good quality bond is performed.

5. An apparatus as recited in claim 1 wherein said sensing means includes a current sensing resistor through which the transducer power signal flows, and includes differential amplifier means responsive to the voltage drop across said current sensing resistor for generating a signal that is representative of the current of said transducer power signal.

6. An apparatus as recited in claim 5 wherein said sensing means further includes rectifying means for producing first and second rectified signals each corresponding to the rectified voltages at opposite ends of said current sensing resistor, wherein one of said rectified signals is indicative of the voltage of the transducer power signal and wherein the difference between said rectified signals is indicative of the current of the transducer power signal.

7. An apparatus as recited in claim 6 wherein said differential amplifier means includes an instrumentation amplifier to receive said first and second rectified signals, and includes compensation means coupled across the two input terminals of said instrumentation amplifier for compensating for the capacitance of said instrumentation amplifier.

8. An apparatus as recited in claim 7 wherein said compensation means includes a capacitor coupled between an input terminal of said instrumentation amplifier and ground and includes an adjustable resistor coupled across two input terminals of said operational amplifier with the wiper thereof connected to ground.

9. An apparatus as recited in claim 1 wherein said signal processing means includes logarithm means for generating a log-impedance signal related to the logarithm of the impedance of the transducer, wherein said log-impedance signal is utilized in generating said synthesized signal.

10. An apparatus as recited in claim 9 wherein said logarithm means includes a log difference amplifier that generates said log-impedance signal by subtracting the logarithm of the measured current of the transducer power signal from the logarithm of the measured voltage of the transducer power signal.

11. An apparatus as recited in claim 9 wherein said signal processing means further includes summing means coupled to the output terminal of said logarithm means for subtracting from said log-impedance signal a value corresponding to the logarithm of the quiescent impedance of the transducer.

12. An apparatus as recited in claim 11 wherein said signal processing means further includes means for linearizing said log-impedance signal and for generating said synthesized signal.

13. An apparatus as recited in claim 1 wherein said integration means includes an integrator circuit that integrates said synthesized signal over said integration time period to compute an analog representation of said bond value.

14. An apparatus as recited in claim 13 wherein said integration means further includes programmable attenuator means for attenuating said synthesized signal so as avoid saturating said integrator circuit.

15. An apparatus as recited in claim 13 wherein said integration means further includes means for converting said analog representation of said bond value into a digital representation thereof.

16. An apparatus as recited in claim 15 wherein said means for converting includes a sample and hold amplifier coupled to an output terminal of said integrator circuit for maintaining the signal level of the output signal of said integrator circuit that exists at the end of said integration time period, and includes an analog-to-digital converter coupled to an output terminal of said sample and hold amplifier for converting said signal level in to a digital representation of said bond value.

17. An apparatus for monitoring the quality of bonding operations performed by an ultrasonic bonding machine, wherein the bonding machine includes an ultrasonic generator that generates a transducer power signal for exciting an ultrasonic transducer to perform each bonding operation, said apparatus comprising:
sensing means for measuring the current and voltage of the transducer power signal during a bonding operation;
signal processing means for combining and filtering the measured current and voltage of the transducer power signal to generate a synthesized signal that is indicative of the logarithm of the impedance of the transducer during bonding;
means for establishing an integration time period starting after the bonding operation begins and ending before the bonding operation ends;
integration means for integrating said synthesized signal over said integration time period to obtain a bond value indicative of the quality of that particular bond; and
data processing means for comparing said bond value to prior bond values obtained during prior acceptable bonding operations, wherein a degree of acceptability of said particular bond is determined by the amount that said bond value deviates from an average of said prior bond values.

18. An apparatus as recited in claim 17 wherein said data processing means determines the quality of each bond relative to prior acceptable bonds by computing a quality factor that is proportional to a normalized deviation of the current bond value from the average of said prior bond values, and wherein said apparatus further comprises indicator means for displaying said quality factor in order to inform an operator of the bonding machine as to the quality of each bond relative to prior acceptable bonds.

19. An apparatus as recited in claim 17 wherein said prior bond values initially consist of bond values collected during consecutive bonding operations all producing good quality bonds, and afterwards said prior bond values are continually updated by discarding the oldest prior bond value and replacing it with the current bond value each time a good quality bond is performed.

20. An apparatus for monitoring the quality of bonding operations performed by an ultrasonic bonding machine, wherein the bonding machine includes an ultrasonic generator that generates a transducer power signal for exciting an ultrasonic transducer to perform each bonding operation, said apparatus comprising:
sensing means for measuring the current and voltage of the transducer power signal during a bonding operation;
rectifying means for rectifying the measured current and voltage of the transducer power signal;
logarithm generating means for dividing the measured and rectified voltage of the transducer power signal by the measured and rectified current thereof to generate a log-impedance signal that corresponds to the logarithm of the impedance of the transducer;
summing means for subtracting an offset value from said log-impedance signal to generate an adjusted signal, wherein said offset value corresponds to the quiescent impedance of the transducer;
filtering means for linearizing said adjusted signal over a portion of the bonding operation;
integration means for integrating said linearized signal over said portion of the bonding operation to obtain a current bond value indicative of the quality of that particular bond;
means for converting the current bond value to a current digital bond value; and
data processing means for creating a data base of prior digital bond values obtained during prior acceptable bonding operations and for comparing the current digital bond value to the prior digital bond values to determine the quality of said particular bond relative to the prior acceptable bonds, wherein the relative quality of said particular bond is determined by the amount that the current digital bond value deviates from an average of said prior digital bond values.

21. A method for monitoring the quality of bonding operations performed by an ultrasonic bonding machine, wherein the bonding machine includes an ultrasonic generator that generates a transducer power signal for exciting an ultrasonic transducer during each bonding operation, said method comprising the steps of:
sensing the current and voltage of the transducer power signal during a bonding operation;
combining the sensed current and voltage of the transducer power signal to generate a synthesized signal, wherein said synthesized signal is indicative of the logarithm of the impedance of the transducer during bonding;
integrating said synthesized signal over an integration time period starting after the bonding operation begins and ending before the bonding operation ends to obtain a current bond value indicative of the quality of that particular bond;
prior to monitoring the quality of a particular bonding operation, performing bonding operations and obtaining bond values therefor, and storing the bond values obtained during those bonding operations that resulted in acceptable bonds; and comparing said current bond value to an average of bond values obtained during prior acceptable bonding operations and indicating a poor quality bond if the current bond value deviates from the average of prior bond values by greater than a predetermined amount.

22. A method as recited in claim 21 wherein the transducer power signal is an alternating current signal, and wherein said step of sensing the current and voltage of the transducer power signal includes the step of rectifying the transducer power signal.

23. A method as recited in claim 21 wherein said step of sensing the current and voltage of the transducer power signal includes the step of sensing the voltage drop across a current sensing resistor through which the transducer power signal flow to determine the current thereof and sensing the voltage at one end of said current sensing resistor to determine the voltage thereof.

24. A method as recited in claim 21 wherein said step of combining and filtering includes the step of subtracting a value corresponding to the quiescent impedance of the transducer so that said synthesized signal is a function only of a dynamic impedance of the transducer during the bonding operation.

25. A method as recited in claim 21 wherein said step of combining and filtering includes the step of filtering out noise in the measured impedance of the transducer.

26. A method as recited in claim 21 wherein said step of integrating results in an analog representation of said bond value, and wherein said method further comprises the step of converting said analog representation of said bond value into a digital representation thereof.

27. A method as recited in claim 21 wherein said step of comparing includes the step of computing the deviation of the current bond value from an average of said prior bond values.

28. A method as recited in claim 21 wherein said prior bond values initially include bond values from a preselected number of consecutive bonding operations each of which produced good quality bonds, and wherein said method further includes the step of continually updating said prior bond values by discarding the oldest prior bond value and replacing it with the current bond value each time a good quality of bond is performed.

29. A method for monitoring the quality of bonding operations performed by an ultrasonic bonding machine, wherein the bonding machine includes an ultrasonic generator that generates a transducer power signal for exciting an ultrasonic transducer to perform each bonding operation, said method comprising the steps of:

sensing the current and voltage of the transducer power signal during a bonding operation;

rectifying the sensed current and voltage of the transducer power signal;

subtracting the logarithm of the sensed and rectified current of the transducer power signal from the logarithm of the sensed and rectified voltage thereof to generate a log-impedance signal that corresponds to the logarithm of the impedance of the transducer;

subtracting an offset value from said log-impedance signal to generate an adjusted signal, wherein said offset value corresponds to the quiescent impedance of the transducer;

filtering said offset signal to produce a linearized signal;

integrating said linearized signal over an integration time period starting after the bonding operation begins and ending before the bonding operation ends to obtain a current bond value indicative of the quality of that particular bond;

converting the current bond value to a current digital bond value;

prior to monitoring the quality of a particular bonding operation, performing bonding operations and obtaining digital bond values therefor, and generating a data base of digital bond values obtained during those bonding operations that resulted in acceptable bonds;

comparing the current digital bond value to an average of prior digital bond values obtained during prior acceptable bonding operations to compute a quality factor that indicates the quality of said particular bond relative to the prior acceptable bonds, wherein said quality factor is proportional to the normalized deviation of the current digital bond value from an average of said prior digital bond values; and indicating the relative quality of that particular bond by displaying said quality factor.

* * * * *